(12) United States Patent
Bodette et al.

(10) Patent No.: US 8,747,125 B2
(45) Date of Patent: Jun. 10, 2014

(54) MITIGATING ELECTROMAGNETIC INTERFERENCE USING DUMMY PLUGS

(71) Applicant: International Business Machines Corporation, Armonk, NY (US)

(72) Inventors: Edward J. Bodette, Cary, NC (US); Michael H. Crowder, Cary, NC (US); Rudolf E. Rehquate, Raleigh, NC (US); Edward S. Suffern, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/848,275

(22) Filed: Mar. 21, 2013

(65) Prior Publication Data
US 2013/0212867 A1    Aug. 22, 2013

Related U.S. Application Data

(62) Division of application No. 13/106,030, filed on May 12, 2011.

(51) Int. Cl.
*H01R 4/58* (2006.01)

(52) U.S. Cl.
USPC .................................................. 439/88

(58) Field of Classification Search
USPC ............ 439/88, 188, 607.01–607.03, 607.14, 439/352–358, 271–275
See application file for complete search history.

(56) References Cited

U.S. PATENT DOCUMENTS

| | | | |
|---|---|---|---|
| 3,328,229 A * | 6/1967 | Windecker | 156/66 |
| 4,189,723 A * | 2/1980 | Hylton | 340/521 |
| 4,857,668 A | 8/1989 | Buonanno | |
| 4,894,749 A | 1/1990 | Elko et al. | |
| 5,195,125 A * | 3/1993 | Bliven et al. | 379/29.01 |
| 5,579,210 A | 11/1996 | Ruhland et al. | |
| 5,855,818 A | 1/1999 | Gan et al. | |
| 6,660,933 B2 | 12/2003 | Festag | |
| 6,723,916 B2 | 4/2004 | Flaherty et al. | |
| 6,935,872 B1 | 8/2005 | Kim et al. | |
| 7,008,565 B2 | 3/2006 | Osherov et al. | |
| 7,353,597 B2 | 4/2008 | Kaplo | |
| 7,611,371 B2 | 11/2009 | Guo | |
| 7,798,828 B2 | 9/2010 | Kuo | |
| 7,815,998 B2 | 10/2010 | Simpson et al. | |

(Continued)

OTHER PUBLICATIONS

Intermark USA, Inc., "EMI Absorber Foam for Anechoic chamber Room—ACF Series", KGS a Kitagawa Company, Mar. 29, 2011, 5 pages.

(Continued)

*Primary Examiner* — Jean F Duverne
(74) *Attorney, Agent, or Firm* — Katherine S. Brown; Jeffrey L. Streets

(57) ABSTRACT

A method of mitigating EMI in an electronic device includes selecting a subset of surface-mount socket connectors on an electronic device to be connected with corresponding working plug connectors and connecting the working plug connectors with the selected subset of socket connectors by inserting the working plug connectors into the selected subset of socket connectors. The method further includes positioning a dummy plug in each of the unselected surface-mount socket connectors, the dummy plug comprising a flexible foam material configured to attenuate electromagnetic radiation by absorption and having a dummy plug profile generally matched to a socket profile of the corresponding socket connector.

4 Claims, 4 Drawing Sheets

(56) References Cited

U.S. PATENT DOCUMENTS

| 7,875,345 | B1 | 1/2011 | Simpson et al. |
| 2003/0203675 | A1 | 10/2003 | McDougall |
| 2004/0258336 | A1 | 12/2004 | Hou |

OTHER PUBLICATIONS

Cisco, "Installation Notes for the Catalyst 3750-X and 3560-X network Modules", Published: Apr. 2010; Cisco Systems, Inc., pp. 1-14.

* cited by examiner

MITIGATING ELECTROMAGNETIC INTERFERENCE USING DUMMY PLUGS

CROSS-REFERENCE TO RELATED APPLICATIONS

This application is a divisional application of U.S. application Ser. No. 13/106,030, filed on May 12, 2011.

BACKGROUND

1. Field of the Invention

The present invention relates to managing electromagnetic interference in electronic devices.

2. Background of the Related Art

Electromagnetic interference (EMI) refers to interference with electronic circuits caused by noise in the electromagnetic frequency spectrum. Some sources of EMI are naturally occurring, such as radiation from the sun, but EMI affecting an electrical circuit is typically caused by other nearby electronic circuitry. Commercial electronic equipment, such as computers and transmitters, are common sources of electromagnetic noise. Other potential sources of EMI include radio transmitters, power lines, electronic circuits, electric motors, and other devices that utilize or detect electromagnetic energy. EMI can propagate from the source to the affected circuit by radiation or induction. For example, data center equipment, such as a network switch, may generate EMI that disturbs circuits in other data center equipment through radiation. EMI generated by a particular piece of equipment may even affect circuits within that same piece of equipment, through induction. Examples of undesirable responses in an electrical circuit caused by EMI include interruption, obstruction, or other degradation of the intended performance of the electrical circuit.

Electromagnetic compatibility (EMC) is a branch of electrical science and engineering concerned with managing EMI to ensure that equipment functions properly within expected levels of electromagnetic radiation in the intended environment of use. For example, in a data center, EMC may focus on ensuring that a densely-packed rack of servers are not adversely affected by any electromagnetic radiation generated by the servers. EMC may also focus on circuits within a specific device component, such as to prevent a high-speed signal on an integrated circuit from affecting or being affected by electrical activity of micro-components within the same integrated circuit. Thus, the field of EMC helps to ensure that a device or system functions without error in its intended electromagnetic environment.

The problems associated with EMI in electronic equipment have led to the promulgation of regulations by standards bodies, such as FCC (Federal Communications Commission) regulations in the United States, EC (European Commission) regulations in Europe, and VCCI (Voluntary Control Council for Interference by Information Technology Equipment) regulations in Japan. Such regulations include electromagnetic emissions limits on electronic equipment. To comply with these regulations, equipment manufacturers have taken steps to reduce electromagnetic emissions, such as by using shielded modular connector jacks. Shielded modular connector jacks have an electrically conductive skin made of metal that protects a connector from emissions by neighboring connectors. Despite such built-in shielding devices, electronic equipment will commonly have some unused and exposed connectors while in service. These exposed connectors contribute to the EMI risks in electronic equipment while in use.

BRIEF SUMMARY

A method of mitigating EMI in an electronic device is further disclosed. According to the method, a subset of surface-mount socket connectors on an electronic device are selected to be connected with corresponding working plug connectors. The working plug connectors are connected with the selected subset of socket connectors by inserting the working plug connectors into the selected subset of socket connectors. A dummy plug is positioned in each of the unselected surface-mount socket connectors. The dummy plug comprises a flexible foam material configured to attenuate electromagnetic radiation, such as by absorption, and has a dummy plug profile generally matched to a socket profile of the corresponding socket connector.

DETAILED DESCRIPTION

Figure 1:
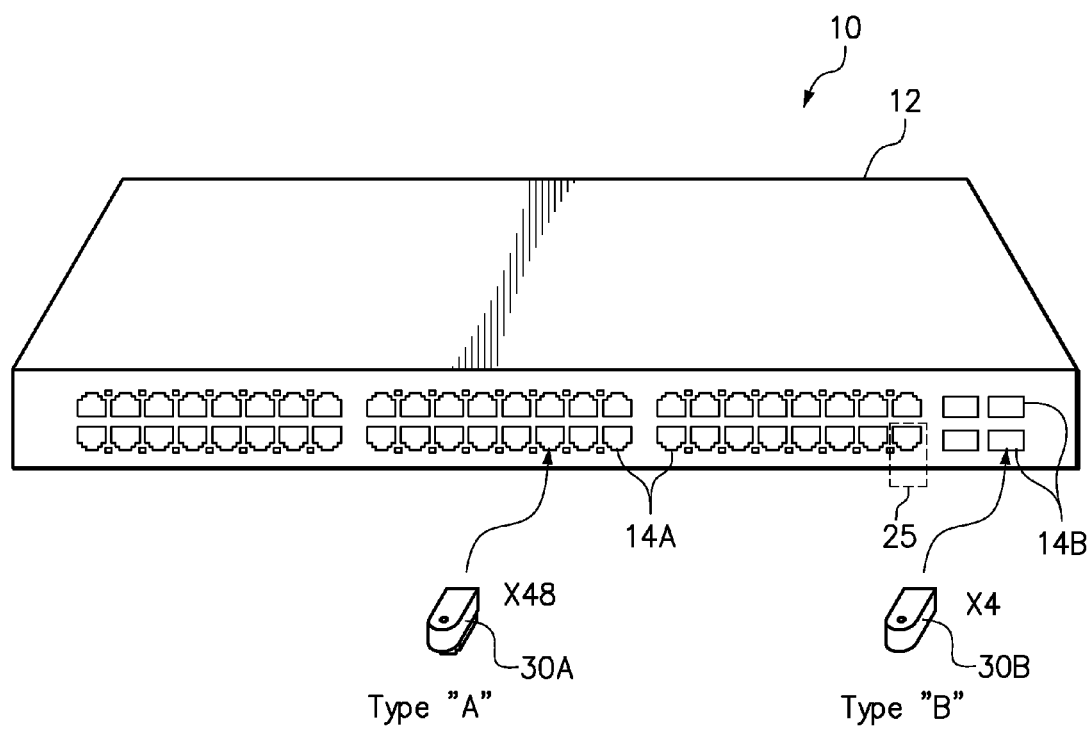
FIG. 1 is a diagram of a system for mitigating EMI in an electronic device having a plurality of surface-mount socket connectors.

A system and method are disclosed for mitigating EMI in an electronic device with "dummy plugs" that are inserted into open sockets to attenuate electromagnetic radiation at the sockets. Any of a variety of suitable conductive foams may be used. For example, one type of foam has a foam matrix and an electrically conductive material dispersed within the foam matrix in an amount effective to attenuate electromagnetic radiation. For each type of socket connector having a pre-defined socket profile, a corresponding dummy plug may be formed having a matching plug profile. A handle may be integrally formed with the dummy plug. The handle may include a stamped through-hole to form a ring, for facilitating insertion and removal by hand. The dummy plug profile may be slightly larger than the socket profile, so that the dummy plug compresses slightly upon insertion and expands against the sides of the socket.

All of the surface-mount socket connectors of a device may be plugged at the factory using plugs of corresponding type. After the electronic device has been shipped to where it will be placed into service, the dummy plugs may be removed from a subset of the socket connectors to be used. Connections to the selected subset of socket connectors may be made using cables according to a desired cabling configuration. The remaining, unused socket connectors may remain plugged with the dummy plugs while the electronic device is in use. The dummy plugs attenuate by absorbing the electromagnetic radiation emanating from or incident to the socket connectors while the electronic device is in use.

In one embodiment, a dummy plug is disclosed for attenuating electromagnetic radiation in an electronic device. The dummy plug includes a dummy plug insertion portion and a grip coupled to the dummy plug. The dummy plug insertion portion comprises a flexible, electrically conductive foam material configured to attenuate electromagnetic radiation, such as by absorption. The dummy plug insertion portion has a dummy plug profile generally matched to a socket profile of a surface-mount socket connector for insertion of the dummy plug insertion portion into the socket connector and is sized to substantially fill the socket connector when positioned in a fully-inserted position. The grip is positioned relative to the dummy plug insertion portion to project outwardly from the socket connector when the dummy plug insertion portion is in the fully-inserted position.

An electronic system is also disclosed. The electronic system includes an electronic device having a plurality of surface-mount socket connectors. Each surface-mount socket connector has a standard socket type. The electronic system also includes a plurality of dummy plugs in one-to-one correspondence with the plurality of surface-mount socket connectors. The dummy plugs comprise a flexible, electrically conductive foam material configured to attenuate electromagnetic radiation, such as by absorption. Each dummy plug has a dummy plug profile generally matched to a socket profile of the corresponding surface-mount socket connector according to socket type for insertion of the dummy plug into the corresponding socket connector. Each dummy plug is sized to substantially fill the corresponding socket connector when positioned in a fully-inserted position. Each dummy plug further includes a grip coupled to the dummy plug, with the grip positioned on the dummy plug to project outwardly from the socket connector when the dummy plug is in the fully-inserted position.

A method of mitigating EMI in an electronic device is further disclosed. According to the method, a subset of surface-mount socket connectors on an electronic device are selected to be connected with corresponding working plug connectors. The working plug connectors are connected with the selected subset of socket connectors by inserting the working plug connectors into the selected subset of socket connectors. A dummy plug is positioned in each of the unselected surface-mount socket connectors. The dummy plug comprises a flexible foam material configured to attenuate electromagnetic radiation, such as by absorption, and has a dummy plug profile generally matched to a socket profile of the corresponding socket connector.

FIG. 1 is a diagram of a system 10 for mitigating EMI in an electronic device 12 having a plurality of surface-mount socket connectors 14A, 14B. The system 10 includes a set of removable foam plugs 30A, 30B for positioning in the socket connectors 14A, 14B to attenuate electromagnetic radiation at the socket connectors 14A, 14B. The disclosed inventive concepts may be applied to any electronic device having socket connectors. By way of example, the electronic device 12 is a network switch 12 having a total of forty-eight "Type A" socket connectors 14A and four "Type B" socket connectors 14B. The Type A and Type B socket connectors 14A, 14B have distinct electrical and mechanical configurations that may be defined according to recognized standards. For example, as illustrated, the Type A socket connector 14A is an RJ45 connector and the Type B socket connector 14B is a small form factor plug (SFP+) connector. The Type A socket connector 14A and Type B socket connector 14B have a socket profile and a pin configuration unique to each connector type, as typically defined according to a standard. The socket profile of the Type A socket connector 14A has a stair-step configuration, whereas the Type B socket connector 14B has a less complicated, generally rectangular configuration. Each Type A socket connector 14A is compatible with a corresponding male plug-type connector (not shown), having a matching plug profile for being received into the Type A socket connector 14A and an electrical configuration for electronic connection with the Type A socket connector 14A. Likewise, each Type B socket connector 14B is compatible with a corresponding plug-type connector (not shown), which has a matching plug profile and electrical configuration for mechanical and electrical connection with the Type B socket connector 14B. The RJ45 connector and SFP+ connector are just two examples of known connector types. It should be recognized that other connection types known in the art, such Quad Small Form Factor plugs (QSFP) and 12× Small Form Factor plug (CXP), and other future-developed connector types may be suitable for use with the invention, and that each of these may include distinct plug/socket profiles defined by type.

The dummy plugs 30A, 30B generally resemble the working plugs of the same type. Type A dummy plugs 30A are provided for plugging the Type A socket connectors 14A and Type B dummy plugs 30B are provided for plugging the Type B socket connectors 14B. The Type A dummy plug 30A is shaped similarly to working Type A electronic plugs, having a plug profile that matches the socket profile of the Type A socket connectors 14A. Likewise, the Type B dummy plug 30B has an plug profile that matches the socket profile of the Type B socket connectors 14B. Matching the socket profile to a corresponding plug profile for a particular socket/plug type allows the socket to uniquely receive a plug of the same type with the plug profile closely conforming to the socket profile. For example, a Type A dummy plug would fit well into a Type A socket connector but not in a Type B socket connector, and vice-versa. Thus, a Type A socket connector 14A can receive either a working Type A plug or a Type A dummy plug 30A, and a Type B socket connector 14B can interchangeably receive either a working Type B plug or a Type B dummy plug 30B. Unlike working plugs, which include operable electrical terminals and wiring leading from the terminals, the dummy plugs 30A, 30B do not have any wiring or electrical terminals, and therefore have no ability to electronically communicate with the socket connectors 14A, 14B. Instead, the dummy plugs 30A, 30B are inserted into any unused socket connectors 14A, 14B to attenuate electromagnetic radiation generated by or incident to the unused socket connectors 14A, 14B.

The dummy plugs 30A, 30B are formed from a special material that attenuates electromagnetic radiation, particularly in the range of 100 MHz to 10 GHz. One type of foam that may be used comprises an electrically non-conductive foam matrix with an electrically-conductive material dispersed within the foam matrix. Examples of suitable, commercially-available foams include "StatFree" 12000 series foam offered by Desco Corp, "Techni-Stat" conductive foam offered by Techni-Tool Corp, and B1300 series foam offered by Botron. Such materials are sometimes referred to in the art as "electrically conductive foam" due to the ability of the material to conduct electrons with less electrical resistance than conventional, non-conductive polymer foams. However, it is understood that the degree of electrical conductivity should be sufficiently low not to bridge or short any exposed electrical terminals within the socket connectors 14A, 14B. For example, the examples of commercially-available foams listed above each have a nominal resistance rating of between about 1,000 to 100,000 ohms/square, per ASTM-D-354-81. In the case of composite foam materials having an electrically-conductive material dispersed within a foam matrix, the degree to which these materials attenuate electromagnetic radiation may be influenced, in part, by the selection and concentration of conductive materials dispersed within the foam matrix. Thus, the desired amount of electromagnetic absorption may be determined according to the dimensions and quantity of socket connectors to be plugged.

Figure 2:
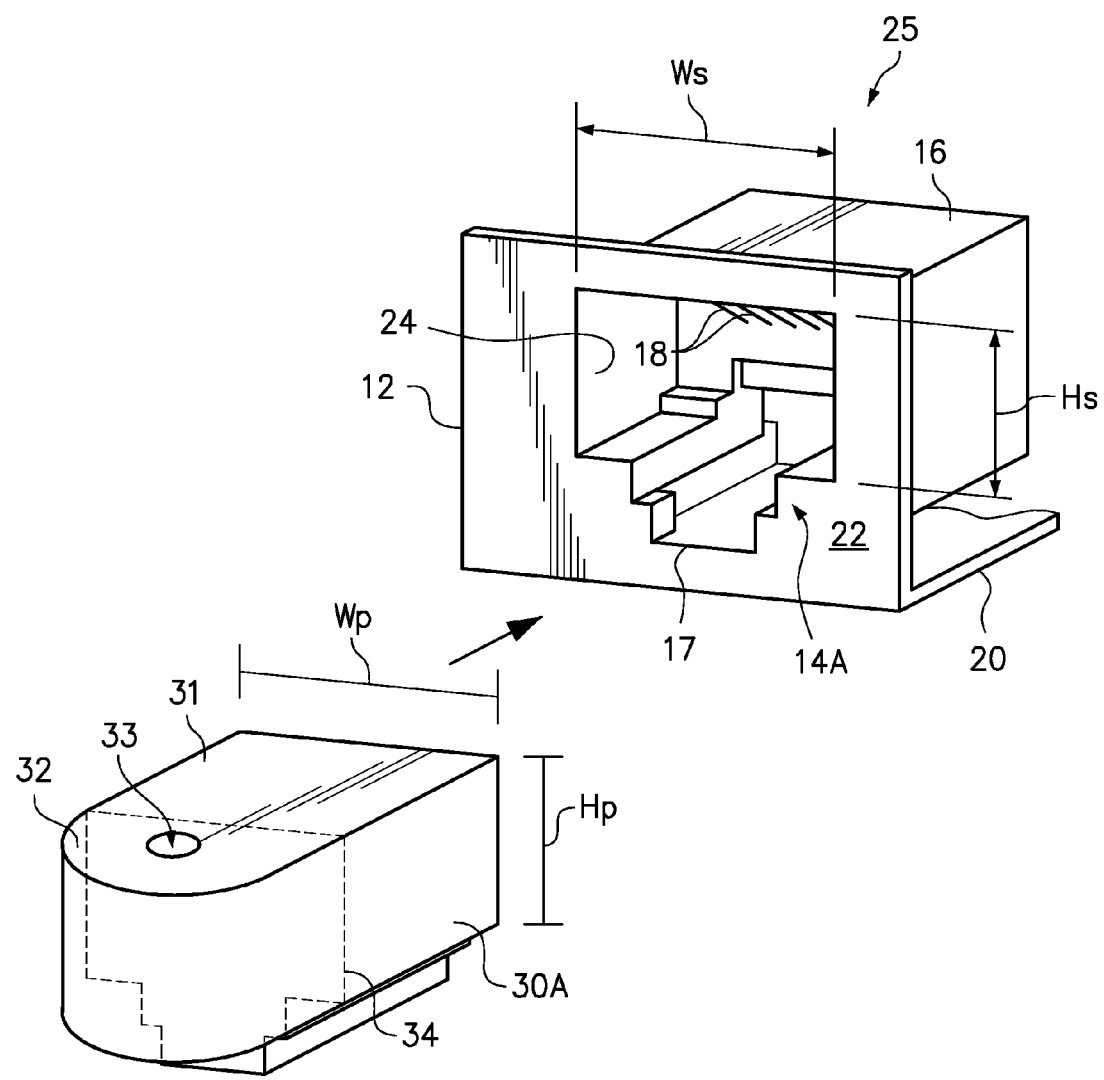
FIG. 2 is a schematic diagram detailing a dummy plug and matching socket connector at a cutaway portion of the electronic device.

FIG. 2 is a schematic diagram detailing a Type A dummy plug 30A and socket connector 14A at a cutaway portion 25 of the electronic device 12 generally outlined in FIG. 1. Although the construction of an electronic device may vary somewhat depending on model and type, the cutaway portion 25 exposes some general construction features of the electronic device 12 that may be included with many different types and models of electronic devices having surface-mount socket connectors. The electronic device 12 includes a housing wall 20, which may be formed from sheet metal or molded plastic. A connector body 16 for the socket connector 14A is mounted to a housing wall 20 of the electronic device 12. The connector body 16 defines the socket profile 24 with a plurality of electrical terminals 18 mounted to the connector body 16 within the socket profile 24. The position of the connector body 16 as mounted to the housing wall 20 positions an opening 17 of the socket connector 14A in general alignment with an outer surface 22 of the electronic device 12. This surface-mount construction of the socket connector 14A provides ready access to the opening 17 of the socket connector 14A for interchangeably inserting either a working plug connector or the foam dummy plug 30A.

A portion of the foam dummy plug 30A to be inserted fully into the socket connector 14A is indicated as "insertion portion" 31. The dummy plug 30A also includes a handle 32. The insertion portion 31 and handle 32 may be integrally formed, which may be inexpensively accomplished by molding the entire dummy plug 30A, including insertion portion 31 and handle 32, together as a single unit. Alternatively, the handle 32 may be formed separately from the insertion portion 31, optionally using the same foam material, and coupled to the insertion portion 31, such as by bonding. The handle 32 includes an optional opening 33, which may be a through-hole, to facilitate gripping. The handle 32 and optional opening 33 resemble a ring. The handle 32 may be gripped between two fingers, with the pads of the fingertips (not shown) engaging the opening 33. For a larger dummy plug, such as might used to plug a larger socket connector, the through hole 33 may be sized to receive the digits of one or more fingers. On a smaller handle 32, the through hole 33 at least allows the pads of a user's fingertips to partially penetrate the through hole 33 for improved grip. The through hole 33 may be inexpensively formed on the handle 32 either by molding the handle 32 to include the through hole 33 or by stamping the handle 32 to form the through hole 33.

The dummy plug 30A has a plug profile 34 that is generally outlined in a dashed line type at 34. The dashed line type is for reference only, and is not intended to indicate any separation between the insertion portion 31 and the handle 32, as the insertion portion 31 and handle 32 may be unitarily formed, as described above. The plug profile 34 is generally matched to the socket profile 24, including having the same stair-step portion around the lower half of each of the plug profile 34 to match the similarly shaped plug profile 24. The matched plug profile 34 and socket profile 24 allows the dummy plug 30A to be aligned with the socket connector 14A and inserted into the socket connector 14A. Dimensions of the plug profile 34 are similar to corresponding dimensions of the socket profile 24, so that the dummy plug 30A may be inserted into the socket connector 14A when aligned with the socket connector 14A. Preferably, the dummy plug will substantially fill as much of the open space inside the socket connector 14A as is practical. For example, a height (Hp) and width (Wp) of the dummy plug 30A are similar to the respective height (Hs) and width (Ws) of the socket connector 14A. The composite foam material used to form the dummy plug 30A is compressible, and the dimensions of the dummy plug 30A may be made slightly larger than the corresponding dimensions of the socket connector 14A, so that the foam dummy plug 30A is slightly compressed upon insertion into the opening 17 of the socket connector. The dummy plug 30A may expand to substantially fill the socket 14A when the insertion portion 31 is fully inserted into the socket connector 14A. In accordance with the invention, a socket connector is substantially filled even though the foam may not expand to fill every minor crevice, such as the space between adjacent conductors in the back of the socket connector.

Figure 3:
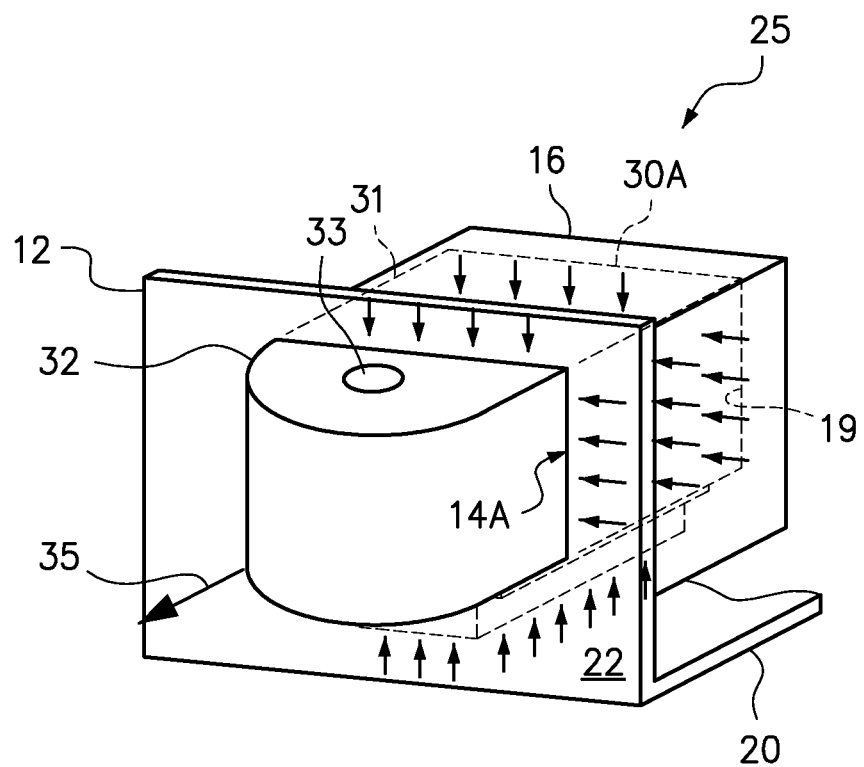
FIG. 3 is a schematic diagram further detailing the cutaway portion of the electronic device, with the dummy plug in a fully inserted position in the socket connector.

FIG. 3 is a schematic diagram further detailing the cutaway portion 25 of the electronic device 12, with the dummy plug 30A in a fully inserted position in the socket connector 14A. In the fully inserted position, the insertion portion 31 of the dummy plug 30A is fully received into the socket connector 14A, with the handle 32 projecting outwardly from the socket connector 14A, beyond the front surface 22 of the housing wall 20. The dummy plug 30A substantially fills the socket connector 14A, with the dummy plug 30A fully engaging the socket profile 24 (FIG. 2), most preferably from the opening 17 of the socket connector 14A all the way back to a rear wall 19 of the socket connector 14A. Plugging the socket connector 14A in this manner, the dummy plug 30A will attenuate electromagnetic radiation that would otherwise enter the electronic device 12 through the socket connector 14A and electromagnetic radiation that would otherwise be radiated from the socket connector 14A and the opening 17. The electronic device 12 of FIG. 1 may be shipped from its site of manufacture to a location of service with dummy plugs inserted into each of the socket connectors to best comply with EMI regulations.

The dimensions of the plug profile 34 are slightly larger than the corresponding dimensions of the socket profile 24 (see FIG. 2), so that the insertion portion 31 is slightly compressed within the socket connector 14A. The compression of the foam dummy plug 30A, and the corresponding outward pressure of the slightly-compressed dummy plug 30A against the socket profile 24, provides frictional contact between the dummy plug 30A and the socket connector 14A to help retain the dummy plug 30A in the socket connector 14A during shipping and use. This pressure is uniformly distributed throughout the socket 14A and along the insertion portion 31, as indicated by the distribution of inwardly-directed arrows at the surface of the insertion portion 31. The uniformly-distributed compression is enabled by having formed the plug profile 34 closely match the socket profile 24, as discussed above. The uniform compression helps to ensure that the dummy plug 30A engages the walls of the socket connector 14A. Preferably, the foam dummy plug 30A will expand to substantially fill any significant voids within the socket connector 14A, such as voids having a cross dimension greater than 5 millimeters.

To initially insert the dummy plug 30A into the socket connector 14A, the dummy plug 30A may be grasped at the handle 32 and pushed by hand into the socket connector 14A to the fully inserted position of FIG. 3. With the dummy plug 30A in the fully inserted position, the handle 32 protrudes outwardly from the socket connector 14A. This makes the handle 32 accessible by hand, such as for later removing the dummy plug 30A when the particular socket connector 14A needs to be connected with a working electronic plug. The dummy plug 30A may be removed from the socket connector 14A by holding the handle 32 and pulling in a removal direction 35. The user's fingers may engage the through hole 33 in the handle 32 for a more secure grip when removing the dummy plug 30A. The foam material of the dummy plug 30A is resilient enough to be inserted and removed many times, as needed, throughout the service life of the electronic device 12. However, the foam material of the dummy plug 30A may also be economically produced, so that the dummy plug 30A may be inexpensively replaced if lost or damaged. Spare dummy plugs 30A may also be stored at the site of manufacture or on-site where the electronic device 12 is placed into service.

Figure 4:
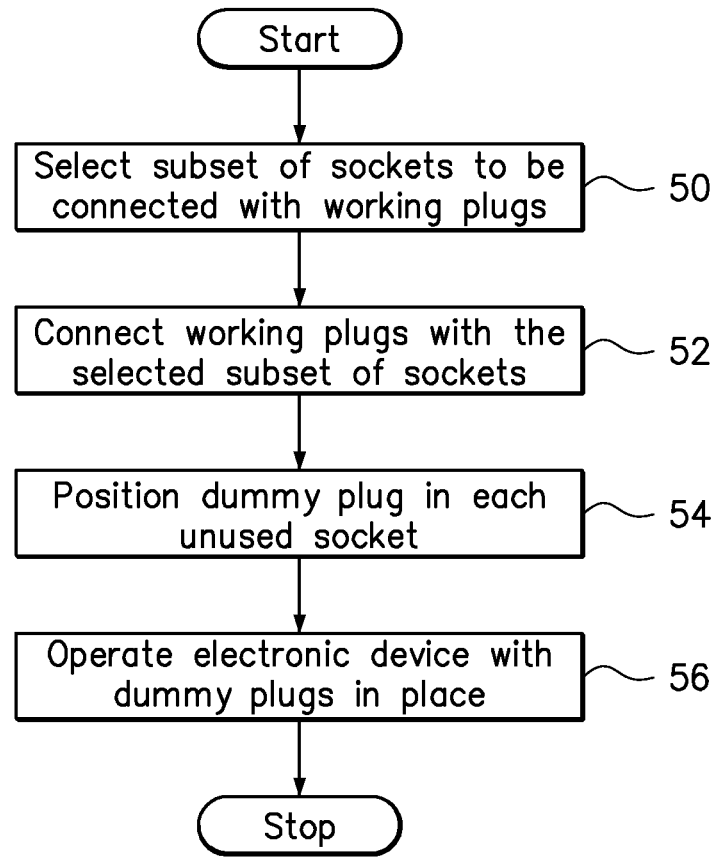
FIG. 4 is a flowchart outlining an example of a method of mitigating EMI in an electronic device.

FIG. 4 is a flowchart outlining an example of a method of mitigating EMI in an electronic device. The steps of the method may be further understood in the context of the system 10 of FIG. 1-3 and its use described above. The electronic device includes a plurality of electronic socket connectors ("sockets"), such as the surface-mount socket connectors discussed above. In step 50, a subset of these sockets is selected for connection with working plugs, such as the plug ends of electronic cables. The subset of sockets may be selected according to application, such as based on a particular system configuration of a system that will incorporate the electronic device. For example, the selection of other electronic devices in the system and a desired cabling configuration for interconnecting those devices may determine the subset of the socket connectors to be used and which socket connectors will remain unused.

In step 52, working plug connectors (plugs) are connected to the socket connectors in the subset selected in step 50. Each working plug has electrical terminals that mate with corresponding socket terminals when connected. The plugs are typically provided on cables, wherein the plug on one end is connected to a socket on a first device and the plug on the opposing end is connected to a socket on another device to establish a connection between the two devices. These connections may be made to achieve a desired system and/or cabling configuration.

Even the working plugs that were connected with the selected subset of socket connectors in step 52 may at least partially mitigate any EMI at the selected subset of socket connectors simply by insertion into the selected subset of socket connectors. However, any empty and unused connectors would still pose a risk for EMI. Therefore, to mitigate any EMI at or affecting the unused socket connectors, a dummy plug is inserted into each of the unused sockets in step 54. The dummy plugs are formed, as described above, from a foam composite material that attenuates electromagnetic radiation. When the system has been fully configured, most or all of the socket connectors may then be occupied either by a working plug or a dummy plug, to minimize the overall EMI issues with the electronic device. If the electronic device is to be subsequently cabled according to a different cabling configuration, dummy plugs may be removed from socket connectors as necessary to accommodate working plugs and inserted as necessary into the socket connectors from which working plugs are not needed for the changed configuration.

In step 56, the electronic device may then be operated normally, with all of the foam dummy plugs in the unused sockets. Because the dummy plugs lack any electronic terminals or other electronic circuitry, the presence of the plugs in the unused socket connectors does not impede the normal functioning of the device. The presence of the plugs in the unused socket connectors only serves to reduce the EMI effects that may otherwise occur within the electronic device or in other system devices.

The selection of the sockets in step 50 may partially depend on the circumstances by which the electronic device is manufactured and placed in service. For some device types, such as the network switch of FIG. 1, many units of the electronic device may be produced according to a standard model number, without prior knowledge of which connectors will be used. Thus, the selected subset of socket connectors to be connected according to step 50 may not be determined until some amount of time after the unit has been manufactured. Alternatively, the electronic device may be made-to-order according to a particular customer specification, in which case a predetermined subset of socket connectors to be used may be predetermined. Regardless of the ultimate use of the electronic device, all of the socket connectors may be plugged at the factory prior to shipping. The purchaser or user may then remove the foam plugs only from the socket connectors to be used, while leaving the foam plugs in the remaining, unused connectors.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of mitigating EMI in an electronic device, comprising:

selecting a subset of surface-mount socket connectors on an electronic device to be connected with corresponding working plug connectors and connecting the working plug connectors with the selected subset of socket connectors by inserting the working plug connectors into the selected subset of socket connectors; and positioning a dummy plug in each of the unselected surface-mount socket connectors, the dummy plug comprising a flexible foam material configured to attenuate electromagnetic radiation by absorption and having a dummy plug profile generally matched to a socket profile of the corresponding socket connector and a grip coupled to the dummy plug, wherein the grip projects outwardly from the socket connector when the dummy plug is in the fully-inserted position.

2. The method of claim 1, further comprising:

initially inserting a dummy plug into each of the socket connectors on the electronic device; and removing the dummy plugs from only the selected subset of socket connectors prior to positioning the working plug connectors in the selected subset of socket connectors.

3. The method of claim 2, further comprising:

inserting a dummy plug into each of the socket connectors on the electronic device at a site of manufacture of the electronic device prior to providing the electronic device to a consumer.

4. A method of mitigating EMI in an electronic device, comprising:

initially positioning a dummy plug in each of a plurality of surface-mount socket connectors on an electronic device, the dummy plug comprising a flexible foam material configured to attenuate electromagnetic radiation by absorption and having a dummy plug profile generally matched to a socket profile of the corresponding socket connector, wherein the dummy plug includes a grip coupled to the dummy plug, and wherein the grip projects outwardly from the socket connector when the dummy plug is in the fully-inserted position;

selecting a subset of the surface-mount socket connectors to be connected with corresponding working plug connectors;

removing the dummy plugs from only the selected subset of socket connectors prior to positioning the working plug connectors in the selected subset of socket connectors, wherein the dummy plugs are removed by pulling on the grip; and connecting the working plug connectors with the selected subset of socket connectors by inserting the working plug connectors into the selected subset of socket connectors.

* * * * *